United States Patent
Takahashi

(10) Patent No.: US 7,952,181 B2
(45) Date of Patent: May 31, 2011

(54) WIRING SUBSTRATE FOR A MULTI-CHIP SEMICONDUCTOR DEVICE

(75) Inventor: Makoto Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 12/051,107

(22) Filed: Mar. 19, 2008

(65) Prior Publication Data

US 2009/0014890 A1    Jan. 15, 2009

(30) Foreign Application Priority Data

Mar. 23, 2007   (JP) ................................. 2007-077307

(51) Int. Cl.
 *H01L 23/02* (2006.01)
(52) U.S. Cl. .. 257/686; 257/777; 257/778; 257/E25.006
(58) Field of Classification Search .................. 257/685, 257/686, 723, 777, 778, 784, 786, 787, E25.006, 257/E25.013, E25.018, E25.021, E25.027, 257/E21.614, E23.085, E23.141
See application file for complete search history.

(56) References Cited

U.S. PATENT DOCUMENTS

| | | | | |
|---|---|---|---|---|
| 4,163,246 | A  * | 7/1979 | Aomura et al. | ............... 257/776 |
| 6,861,760 | B2 | 3/2005 | Oka et al. | |
| 6,879,031 | B2 | 4/2005 | Wang | |
| 7,026,719 | B2 | 4/2006 | Wang | |
| 7,334,476 | B2 * | 2/2008 | Ichikawa | ............... 73/514.33 |

FOREIGN PATENT DOCUMENTS

| | | |
|---|---|---|
| JP | 59094441 | 5/1984 |
| JP | 02000168142 * | 6/2000 |
| JP | 2001177050 | 6/2001 |
| JP | 2004-288813 | 10/2004 |
| JP | 2005260053 | 9/2005 |
| JP | 2006086150 | 3/2006 |

OTHER PUBLICATIONS

Japanese Office Action dated Sep. 29, 2009 corresponding to U.S. Appl. No. 12/051,107, filed Mar. 19, 2008.
Japanese Office Action corresponding to U.S. Appl. No. 12/051,107 mailed on Jun. 30, 2009.

* cited by examiner

*Primary Examiner* — A. Sefer
*Assistant Examiner* — Dilinh P Nguyen
(74) *Attorney, Agent, or Firm* — Turocy & Watson, LLP

(57) ABSTRACT

An interposer has an opening in the central portion. A plurality of first electrode terminals are formed on the front surface near the opening of the interposer, a plurality of second electrode terminals are formed on the front surface of the peripheral portion thereof and corresponding ones of the plurality of first and second electrode terminals are electrically connected to one another via a plurality of wirings. A plurality of bump electrodes is formed on the front surface of a child chip. A plurality of bump electrodes containing a plurality of bump electrodes for connection with the exterior are formed on the front surface of a parent chip. The front surfaces of the parent chip and child chip are set to face each other with the interposer disposed therebetween and the bump electrodes are electrically connected to one another in the opening of the interposer.

6 Claims, 6 Drawing Sheets

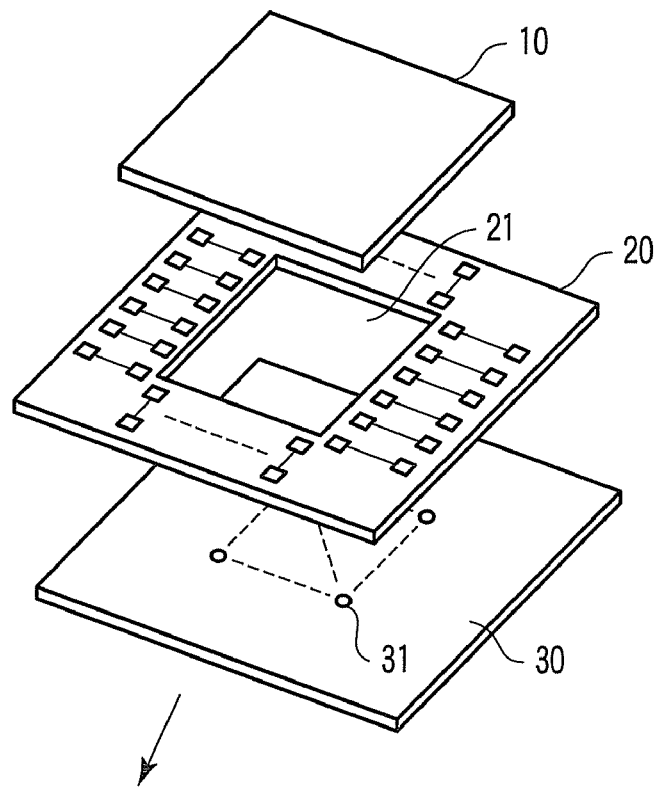
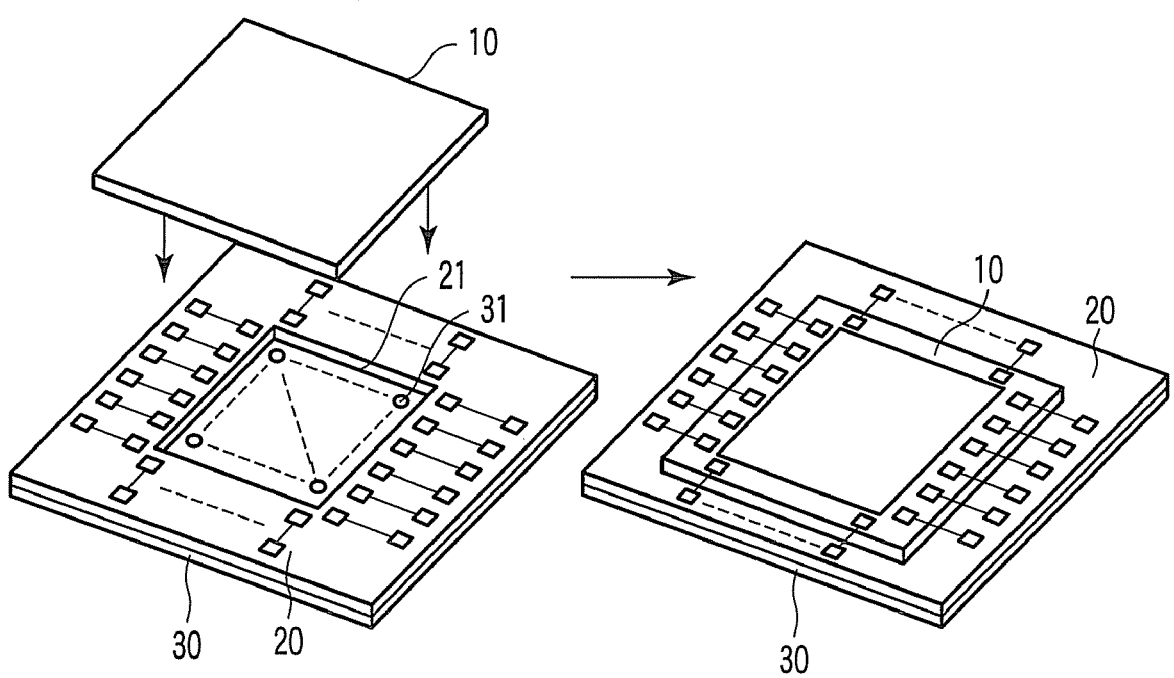
FIG. 2A
FIG. 2B
FIG. 2C

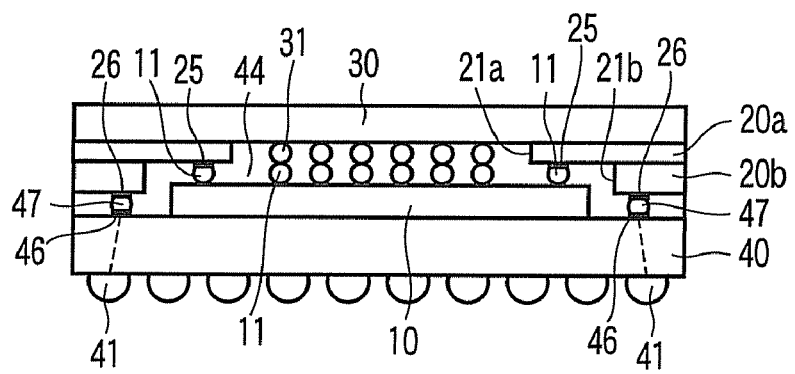
F I G. 6
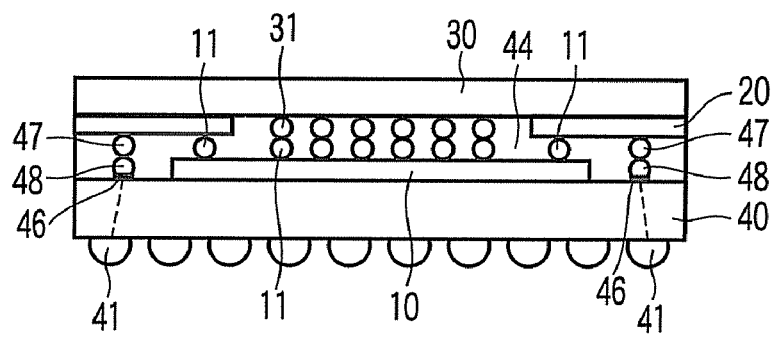
F I G. 7
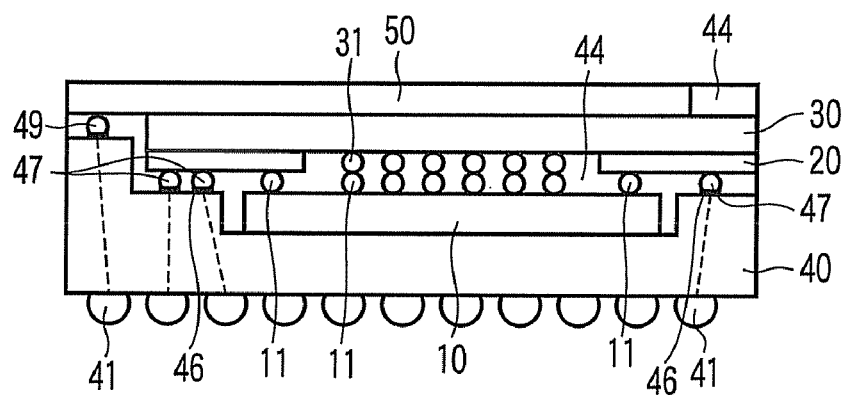
F I G. 8

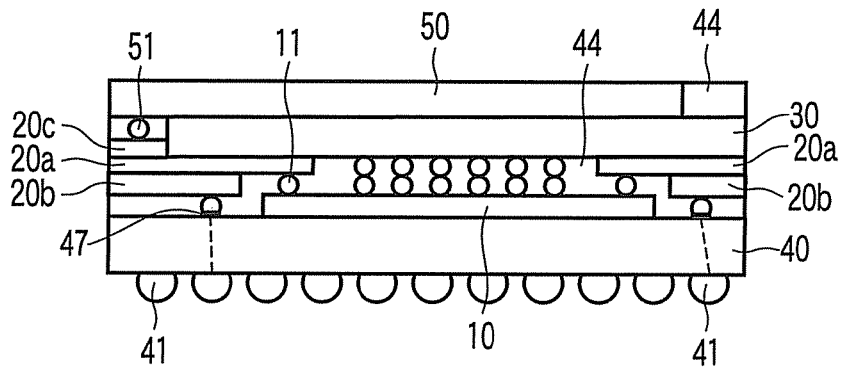
F I G. 9
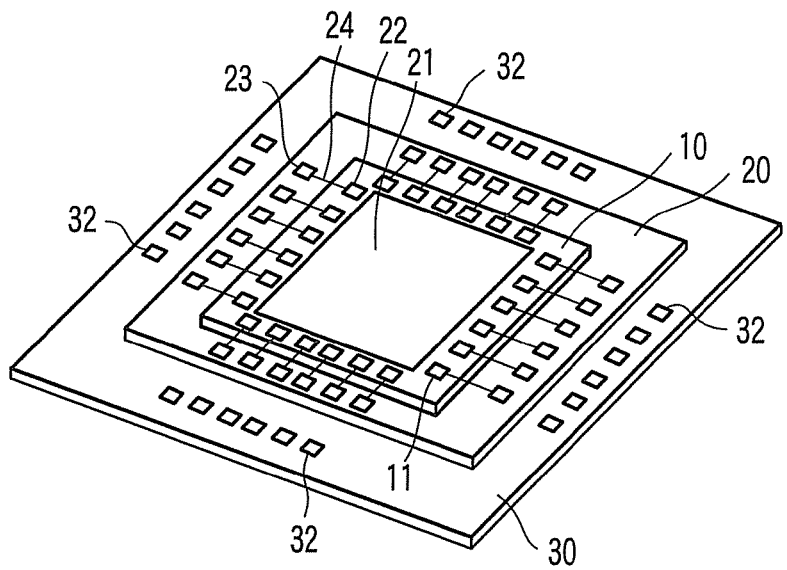
F I G. 10
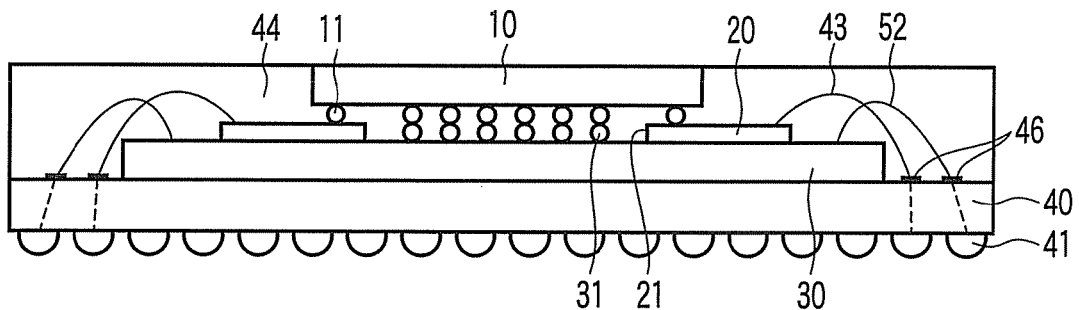
F I G. 11

WIRING SUBSTRATE FOR A MULTI-CHIP SEMICONDUCTOR DEVICE

CROSS-REFERENCE TO RELATED APPLICATIONS

This application is based upon and claims the benefit of priority from prior Japanese Patent Application No. 2007-077307, filed Mar. 23, 2007, the entire contents of which are incorporated herein by reference.

BACKGROUND OF THE INVENTION

1. Field of the Invention

This invention relates to a multi-chip semiconductor device having a plurality of semiconductor chips formed thereon, and more particularly, to a multi-chip semiconductor device having a plurality of semiconductor chips of planar shapes of different sizes mounted thereon.

2. Description of the Related Art

A multi-chip semiconductor device is known which is obtained by stacking a logic chip such as ASIC on a semiconductor memory chip with large capacity in a face-to-face fashion and connecting the chips to each other by use of connection means such as bumps. In the above multi-chip semiconductor device, generally, the logic chip is used as a parent chip and the semiconductor memory chip is used as a child chip. The parent chip transfers signals with respect to the exterior of the chip. Therefore, it is necessary to lead out terminals for connection with the exterior from the parent chip. However, in a case where the planar shape of the parent chip is smaller than that of the child chip and the terminals for connection with the exterior of the parent chip are hidden by the child chip, the external terminals cannot be lead out from the parent chip.

In order to solve the above problem, for example, it is considered that a mounting substrate on which wirings are made to permit a plurality of semiconductor chips to be mounted thereon is prepared and a plurality of semiconductor chips are mounted on the mounting substrate in a planar form. However, with this method, the semiconductor device is made larger.

A semiconductor device having a plurality of semiconductor chips stacked in a thickness direction of the semiconductor chips with a film type substrate disposed therebetween is disclosed in Oka et al. (U.S. Pat. No. 6,861,760).

BRIEF SUMMARY OF THE INVENTION

According to a first aspect of the present invention, there is provided a multi-chip semiconductor device which includes a wiring substrate having an opening formed in a central portion, a plurality of first electrode terminals arranged and formed on a front surface thereof near the opening, a plurality of second electrode terminals arranged and formed on the front surface of a peripheral portion thereof and a plurality of wirings which electrically connect corresponding ones of the plurality of first and second electrode terminals and are formed on a front surface thereof, a first semiconductor chip having a plurality of first bump electrodes arranged and formed on a front surface thereof, and a second semiconductor chip which has a plurality of second bump electrodes containing a plurality of bump electrodes for connection with an exterior arranged and formed on a front surface thereof and is arranged with the front surface thereof set to face the front surface of the first semiconductor chip with the wiring substrate disposed therebetween, those of the plurality of second bump electrodes other than the plurality of bump electrodes for connection with the exterior being electrically connected to the plurality of first bump electrodes of the first semiconductor chip in the opening of the wiring substrate and the plurality of second bump electrodes for connection with the exterior being electrically connected to the plurality of first electrode terminals of the wiring substrate.

According to a second aspect of the present invention, there is provided a multi-chip semiconductor device which includes a first wiring substrate having a first opening formed in a central portion and a plurality of first electrode terminals formed on a front surface thereof near the first opening, a second wiring substrate stacked on the first wiring substrate and having a second opening of an area larger than that of the first opening formed in a central portion and a plurality of second electrode terminals electrically connected to the plurality of first electrode terminals and formed on the front surface thereof near the second opening, a first semiconductor chip having a plurality of first bump electrodes arranged on a front surface thereof, a second semiconductor chip which has a plurality of second bump electrodes containing a plurality of bump electrodes for connection with an exterior arranged and formed on a front surface thereof and is arranged with the surface thereof set to face the front surface of the first semiconductor chip with the first and second wiring substrates disposed therebetween, those of the plurality of second bump electrodes other than the bump electrodes for connection with the exterior being electrically connected to the plurality of first bump electrodes of the first semiconductor chip in the first and second openings of the first and second wiring substrates and the plurality of second bump electrodes for connection with the exterior being electrically connected to the plurality of first electrode terminals of the first wiring substrate, a package substrate having a plurality of electrodes for connection with the exterior formed on a front surface, a back surface thereof being adhered to a back surface of the second semiconductor chip and a plurality of third electrode terminals electrically connected to the plurality of electrodes for connection with the exterior being formed on the back surface thereof, and a plurality of third bump electrodes which electrically connect the plurality of third electrode terminals of the package substrate with the plurality of second electrode terminals of the second wiring substrate.

According to a third aspect of the present invention, there is provided a multi-chip semiconductor device which includes a wiring substrate having an opening formed in a central portion, a plurality of first electrode terminals arranged and formed on a front surface thereof near the opening, a plurality of second electrode terminals arranged and formed on the front surface of a peripheral portion thereof and a plurality of wirings used to electrically connect corresponding ones of the plurality of first and second electrode terminals and formed on the front surface thereof, a first semiconductor chip having a plurality of first bump electrodes arranged on a front surface thereof, a second semiconductor chip which has a plurality of second bump electrodes containing a plurality of bump electrodes for connection with an exterior arranged and formed on a front surface thereof and is arranged with the front surface thereof set to face the front surface of the first semiconductor chip with the wiring substrate disposed therebetween, those of the plurality of second bump electrodes other than the plurality of bump electrodes for connection with the exterior being electrically connected to the plurality of first bump electrodes of the first semiconductor chip in the opening of the wiring substrate and the plurality of second bump electrodes for connection with the exterior being electrically connected to the plurality of first electrode terminals of the wiring substrate, and a third semiconductor chip adhered to a back surface of the first semiconductor chip.

BRIEF DESCRIPTION OF THE SEVERAL VIEWS OF THE DRAWING

FIGS. 2A to 2C are perspective views for illustrating an assembling method of the multi-chip semiconductor device of FIG. 1;

FIG. 6 is a cross-sectional view of a multi-chip semiconductor device according to a fourth embodiment of this invention;

FIG. 7 is a cross-sectional view of a multi-chip semiconductor device according to a fifth embodiment of this invention;

FIG. 8 is a cross-sectional view of a multi-chip semiconductor device according to a sixth embodiment of this invention;

FIG. 9 is a cross-sectional view of a multi-chip semiconductor device according to a seventh embodiment of this invention;

FIG. 10 is a perspective view of a multi-chip semiconductor device partly shown in a see-through form according to an eighth embodiment of this invention;

FIG. 11 is a cross-sectional view of a multi-chip semiconductor device obtained by mounting the multi-chip semiconductor device assembled as shown in FIG. 10 on a package substrate and resin-sealing the thus obtained structure;

DETAILED DESCRIPTION OF THE INVENTION

Embodiments of the present invention will be described with reference to the accompanying drawings. In the explanation, portions commonly used throughout the entire drawings are denoted by the same reference symbols.

First Embodiment

Figure 1A:
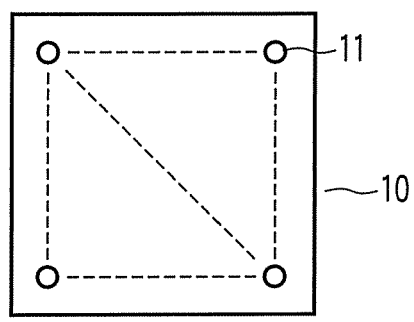
FIGS. 1A to 1C are plan views showing main parts configuring a multi-chip semiconductor device according to a first embodiment of this invention.
Figure 1B:
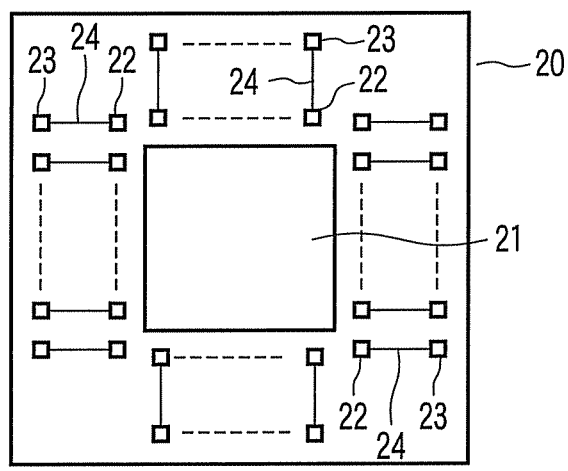
Figure 1C:
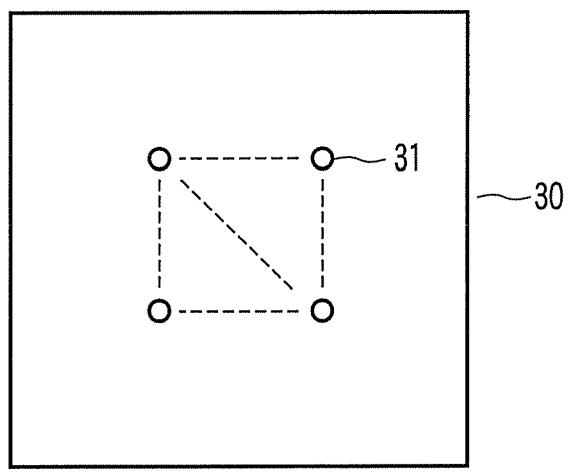

FIGS. 1A to 1C are plan views showing main parts configuring a multi-chip semiconductor device according to a first embodiment of this invention. In FIG. 1A, for example, a parent chip 10 formed of a logic chip such as an application-specific integrated circuit (ASIC) is shown. A plurality of bump electrode 11 are arranged and formed in a matrix form on the front surface of the parent chip 10. Those of the plurality of bump electrode 11 which are arranged on the outermost periphery are bump electrodes for connection with the exterior to transfer signals with respect to the exterior of the chip and the remaining ones of the bump electrodes 11 are bump electrodes to transfer signals with respect to a child chip which will be described later.

FIG. 1B shows an interposer (wiring substrate) 20 with a square planar shape formed of a synthetic resin thin-film substrate such as a synthetic resin film or synthetic resin tape and it has a square opening 21 formed in the central portion thereof. The planar shape of the opening 21 is smaller than the planar shape of the parent chip 10. A plurality of electrode terminals (electrode pads) 22 are formed on the front surface near the opening 21 of the interposer 20 and a plurality of electrode terminals (electrode pads) 23 are formed on the front surface of the peripheral portion. Further, a plurality of wirings 24 which electrically connect corresponding ones of the plurality of electrode terminals 22, 23 to one another are formed on the front surface of the interposer 20.

FIG. 1C shows a child chip 30 such as a semiconductor memory chip electrically connected to the parent chip 20 of FIG. 1A, for example. A plurality of bump electrodes 31 are arranged and formed in a matrix form on the front surface of the child chip 30. The bump electrodes 31 formed on the child chip 30 are used to transfer signals with respect to the bump electrodes 11 of the parent chip 10 other than the bump electrodes for connection with the exterior. The planar shape of the child chip 30 is larger than the planar shape of the parent chip 10. In FIG. 1, a case wherein the size of the planar shape of the interposer 20 is substantially the same as that of the child chip 30 is shown. However, the size of the planar shape of the interposer 20 is not limited to this case, and may be set smaller or larger than that of the child chip 30.

The multi-chip semiconductor device according to the present embodiment is assembled as shown in FIGS. 2A to 2C. As shown in FIG. 2A, the parent chip 10 and child chip 30 are arranged with the bump electrodes thereof set to face each other with the interposer 20 disposed therebetween. In this case, the surface on which the electrode terminals and wirings of the interposer 20 are formed is set to face the bump electrode formation surface of the parent chip 10.

As shown in FIG. 2B, the back surface of the interposer 20 is adhered to the front surface side of the child chip 30 by use of an insulating adhesive agent or the like. At this time, the bump electrodes 31 formed on the front surface of the child chip 30 are exposed to the opening 21 of the interposer 20.

Further, after the parent chip 10 is superimposed on the interposer 20, they are subjected to a pressurizing process and heating process. Then, as shown in FIG. 2C, the bump electrodes 11 for connection with the exterior arranged on the outermost periphery of the front surface of the parent chip 10 are electrically connected to the electrode terminals 22 of the interposer 20 formed near the opening 21. Further, the bump electrodes 11 which are different from the bump electrodes for connection with the exterior and are arranged on the front surface of the parent chip 10 are electrically connected to the bump electrodes 31 formed on the front surface of the child chip 30 in the opening 21 of the interposer 20. In FIG. 2C, for easy understanding, part of the interposer 20 which is superimposed on the parent chip 10 is shown in a see-through form.

Figure 3:
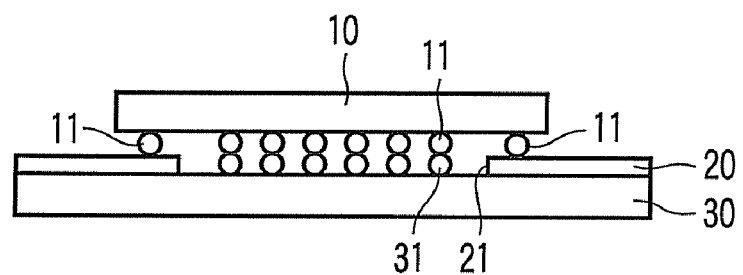
FIG. 3 is a cross-sectional view of the multi-chip semiconductor device assembled as shown in FIG. 2.

The cross-sectional structure of the multi-chip semiconductor device thus assembled is shown in FIG. 3. That is, the multi-chip semiconductor device shown in FIG. 3 includes an interposer 20 which has an opening 21, a plurality of electrode terminals (electrode terminals 22 in FIG. 1B) formed on the front surface near the opening 21, a plurality of electrode terminals (electrode terminals 23 in FIG. 1B) formed on the front surface of the peripheral portion and a plurality of wirings (wirings 24 in FIG. 1B) formed to electrically connect corresponding ones of the plurality of electrode terminals (22, 23) to one another, and a child chip 30 having a plurality of bump electrodes (bump electrodes 31 in FIG. 1C) formed on the front surface. In addition, it includes a parent chip 10 on which a plurality of bump electrodes (bump electrodes 11 in FIG. 1A) containing a plurality of bump electrodes for connection with the exterior are formed on the front surface and which is arranged with the front surface thereof set to face the front surface of the child chip 30. The bump electrodes among the plurality of bump electrodes 11 other than the bump electrodes for connection with the exterior are electrically connected to the bump electrodes 31 of the child chip 30 in the opening 21 of the interposer 20 and the bump electrodes 11 for connection with the exterior are electrically connected to the plurality of electrode terminals (electrode terminals 22 in FIG. 1B) of the interposer 20.

As shown in FIG. 3, the parent chip 10 can be easily electrically connected to the chip exterior since the bump electrodes 11 for connection with the exterior of the parent chip 10 are lead out via the electrode terminals 22, wirings 24 and electrode terminals 23 (which are shown in FIG. 1) formed on the interposer 20 even if the planar shape of the parent chip 10 is smaller than that of the child chip 30 and the bump electrodes 11 for connection with the exterior of the parent chip 10 are hidden by the child chip 30.

Further, as is clearly seen from FIG. 3, the planar shape of the semiconductor device is made substantially the same as that of the child chip 30 and the device can be prevented from being made larger.

Second Embodiment

Figure 4:
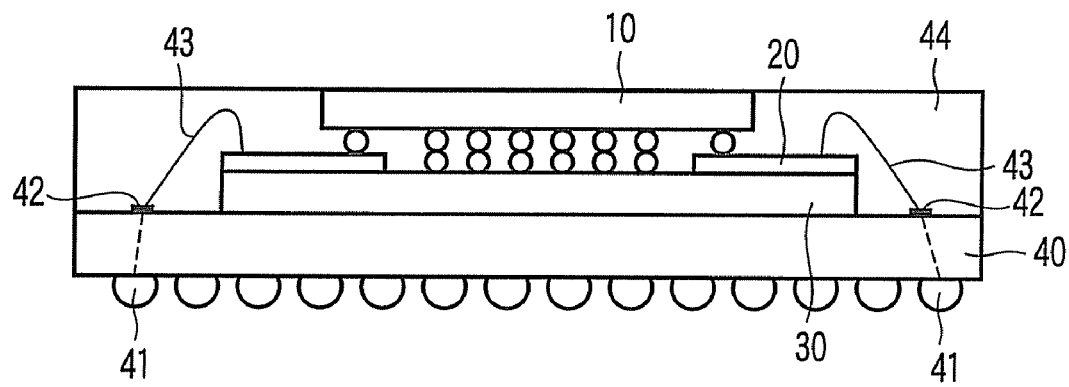
FIG. 4 is a cross-sectional view of a multi-chip semiconductor device according to a second embodiment of this invention.

FIG. 4 is a cross-sectional view of a multi-chip semiconductor device according to a second embodiment of this invention. The multi-chip semiconductor device of FIG. 4 is obtained by mounting the multi-chip semiconductor device assembled as shown in FIG. 3 on a package substrate 40, electrically connecting the package substrate 40 to the electrode terminals 23 of the interposer 20 and resin-sealing the thus obtained structure.

That is, a plurality of bump electrodes 41 for connection with the exterior are formed on the front surface of the package substrate 40. Further, the back surface of the child chip 30 is adhered to the back surface of the package substrate 40 by use of an insulating mounting agent, for example, paste or the like. On the back surface of the package substrate 40, a plurality of electrode terminals 42 electrically connected to the bump electrodes 41 formed on the front surface thereof are formed (indicated by broken lines in FIG. 4). The electrode terminals 42 formed on the back surface of the package substrate 40 are connected to the electrode terminals 23 formed on the interposer 20 via bonding wires (metal wires) 43. Sealing resin 44 is filled onto the back surface of the package substrate 40.

In the multi-chip semiconductor device of the present embodiment, the same effect as that of the multi-chip semiconductor device according to the first embodiment shown in FIG. 3 can be attained.

Third Embodiment

Figure 5:
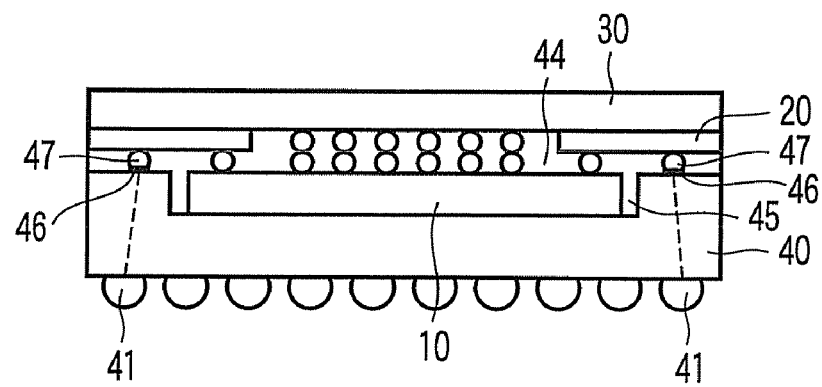
FIG. 5 is a cross-sectional view of a multi-chip semiconductor device according to a third embodiment of this invention.

FIG. 5 shows a cross section of a multi-chip semiconductor device according to a third embodiment of this invention. In the multi-chip semiconductor device of FIG. 4, in order to make connections by use of bonding wires, it is necessary to use a package substrate having a planar shape larger than that of the child chip 30 as the package substrate 40 and the device size is made larger than that of the multi-chip semiconductor device of FIG. 3. Therefore, in the multi-chip semiconductor device of FIG. 5, a device can be formed with substantially the same size as that of the multi-chip semiconductor device of FIG. 3 by making a design so as not to use bonding wires.

That is, in the multi-chip semiconductor device of FIG. 5, as the package substrate 40 having the front surface on which a plurality of bump electrodes 41 for connection with the exterior are formed, a package substrate thicker than that in the case of FIG. 4 is used. A concave portion 45 into which the parent chip 10 can be received is formed on the back surface side. In the concave portion 45, the parent chip 10 is received with the back surface side set downward and they are adhered together by use of an insulating mounting agent, for example, paste or the like. Further, a plurality of electrode terminals 46 are formed on the back surface of an area other than the concave portion 45 of the package substrate 40. The electrode terminals 46 are electrically connected to the bump electrodes 41 for connection with the exterior formed on the front surface (indicated by broken lines in FIG. 5). The electrode terminals 46 formed on the back surface of the package substrate 40 and the electrode terminals 23 formed on the interposer 20 are connected to one another via a plurality of bump electrodes 47. Like the case of FIG. 4, sealing resin 44 is filled onto the back surface of the package substrate 40.

In the multi-chip semiconductor device of the present embodiment, the same effect as that of the multi-chip semiconductor device according to the first embodiment shown in FIG. 3 can be attained.

Fourth Embodiment

FIG. 6 shows a cross section of a multi-chip semiconductor device according to a fourth embodiment of this invention. Also, in the multi-chip semiconductor device of FIG. 6, a device can be formed with substantially the same size as that of the multi-chip semiconductor device of FIG. 3 by making a design so as not to use bonding wires.

In the multi-chip semiconductor device of FIG. 6, as an interposer, there are provided a first interposer 20a having a first opening 21a in the central portion and a plurality of electrode terminals 25 formed on the front surface near the first opening 21a and a second interposer 20b stacked on the first interposer 20a and having a second opening 21b of an area larger than that of the first opening 21a in the central portion and a plurality of electrode terminals 26 electrically connected to the electrode terminals 25 on the front surface of the first interposer 20a and formed on the front surface near the second opening 21b.

A plurality of bump electrodes 41 for connection with the exterior are formed on the front surface of a package substrate 40. The back surface of a parent chip 10 is adhered to the back surface of the package substrate 40 by use of an insulating mounting agent, for example, paste or the like. On the back surface of the package substrate 40, a plurality of electrode terminals 46 electrically connected to the bump electrodes 41 for connection with the exterior formed on the front surface thereof are formed. The electrode terminals 46 formed on the back surface of the package substrate 40 are connected to the electrode terminals 26 formed on the second interposer 20b via a plurality of bump electrodes 47 so as to make an electrical connection between the parent chip 10 and the bump electrodes 41. Sealing resin 44 is filled in between the package substrate 40 and a child chip 30.

That is, the multi-chip semiconductor device of FIG. 6 includes the first interposer 20a having the first opening 21a formed in the central portion and the electrode terminals 26 formed the front surface near the first opening 21a, the second interposer 20b stacked on the first interposer 20a and having the second opening 21b of an area larger than that of the first opening 21a in the central portion and the electrode terminals 26 electrically connected to the electrode terminals 25 on the first interposer 20a and formed on the front surface near the second opening 21b and the child chip 30 having the bump electrodes 31 formed on the front surface. Further, it includes the parent chip 10 which has a plurality of bump electrodes 11 containing a plurality of bump electrodes for connection with the exterior and formed on the front surface and is arranged with the front surface thereof set to face the front surface of the child chip 30 and in which those of the plurality of bump electrodes 11 other than the bump electrodes for connection with the exterior are electrically connected to the bump electrodes 31 of the child chip 30 in the first and second openings 21a, 21b of the interposers 20a, 20b and the bump electrodes for connection with the exterior are electrically connected to the electrode terminals 25 of the interposer 20a, the package substrate 40 which has the bump electrodes 41 for connection with the exterior formed on the front surface and has the electrode terminals 46 electrically connected to the bump electrodes 41 and formed on the back surface and to the back surface of which the parent chip 10 is adhered, and the bump electrodes 47 which electrically connect the electrode terminals 46 of the package substrate 40 with the electrode terminals 26 of the second interposer 20b.

In the present embodiment, a case wherein the second interposer 20b is stacked on the first interpose 20a is explained, but one interposer integrally formed and having a cross section as shown in FIG. 6 can be used. Like the various embodiments explained before, the first and second interposers 20a, 20b or one interposer integrally formed can be configured by use of a silicon thin-film substrate or synthetic resin thin-film substrate.

In the multi-chip semiconductor device of the present embodiment, the same effect as that of the multi-chip semiconductor device according to the first embodiment shown in FIG. 3 can be attained.

Fifth Embodiment

FIG. 7 shows a cross section of a multi-chip semiconductor device according to a fifth embodiment of this invention. In the multi-chip semiconductor device of FIG. 5, in order to attain the multi-chip semiconductor device with the same size as that of the multi-chip semiconductor device of FIG. 3, the package substrate having substantially the same thickness as that of FIG. 4 is used as the package substrate 40 and the concave portion 45 is formed on the back surface side.

On the other hand, in the multi-chip semiconductor device of FIG. 7, a package substrate having substantially the same thickness as that of FIG. 4 is used as the package substrate 40 and a parent chip having smaller chip thickness is used as the parent chip 10.

As shown in FIG. 7, a plurality of electrode terminals 41 formed on the back surface of the package substrate 40 are connected with electrode terminals 23 formed on an interposer 20 via a plurality of bump electrodes 47 formed on the interposer 20 side and a plurality of bump electrodes 48 formed on the package substrate 40 side. Like the case of FIG. 6, sealing resin 44 is filled in between the package substrate 40 and a child chip 30.

The parent chip 10 has substantially the same thickness as the height of the bump electrode, particularly, the bump electrode 48 on the package substrate 40 side. The general height of the bump electrode is approximately 20 to 30 μm. Therefore, the thickness of the parent chip 10 is set to approximately 20 to 30 μm.

In the multi-chip semiconductor device of the present embodiment, the same effect as that of the multi-chip semiconductor device according to the first embodiment shown in FIG. 3 can be attained.

Sixth Embodiment

FIG. 8 shows a cross section of a multi-chip semiconductor device according to a sixth embodiment of this invention. In the multi-chip semiconductor device of FIG. 8, a different child chip 50 is adhered to the back surface of the child chip 30 used in the multi-chip semiconductor device of FIG. 5 by use of an insulating adhesive agent. Further, the different child chip 50 is electrically connected to a parent chip 10 via a plurality of bump electrodes 49, wirings formed in a package substrate 40, a plurality of bump electrodes 47, electrode terminals and wirings on an interposer 20 and bump electrodes 11 on the parent chip 10.

Further, the different child chip 50 and the bump electrodes 41 of the package substrate 40 can be electrically connected to each other via the bump electrodes 49 and wirings formed in the package substrate 40.

In the present embodiment, the same effect as that of the multi-chip semiconductor device according to the first embodiment shown in FIG. 3 can be attained and a multi-chip semiconductor device having three semiconductor chips can be obtained.

Seventh Embodiment

FIG. 9 shows a cross section of a multi-chip semiconductor device according to a seventh embodiment of this invention. In the multi-chip semiconductor device of FIG. 9, a different child chip 50 is adhered to the back surface of the child chip 30 used in the multi-chip semiconductor device of FIG. 6 by use of an insulating adhesive agent. Further, a third interposer 20c is stacked on the surface of a first interposer 20a which is opposite to the stacked surface of a second interposer 20b and the different child chip 50 is electrically connected to a parent chip 10 via a plurality of bump electrodes 51, wirings formed in the third interposer 20c, wirings formed in the first interposer 20a and a plurality of bump electrodes 11.

Further, the different child chip 50 and the bump electrodes 41 of the package substrate 40 can be electrically connected to each other via the bump electrodes 51, wirings formed in the third interposer 20c, wirings formed in the first interposer 20a, wirings formed in the second interposer 20b and bump electrodes 47.

In the present embodiment, a case wherein the second and third interposers 20b, 20c are stacked on the first interposer 20a is explained. However, one interposer integrally formed and having a cross section as shown in FIG. 9 can be used. Like the various embodiments explained before, the first, second and third interposers 20a, 20b, 20c or one interposer integrally formed can be configured by use of a silicon thin-film substrate or synthetic resin thin-film substrate.

In the present embodiment, the same effect as that of the multi-chip semiconductor device according to the first embodiment shown in FIG. 3 can be attained and a multi-chip semiconductor device having three semiconductor chips can be obtained.

Eighth Embodiment

FIG. 10 is a perspective view showing a multi-chip semiconductor device according to an eighth embodiment of this invention partly shown in a see-through form. In each of the multi-chip semiconductor devices of the above embodiments, only the parent chip is electrically connected to the chip exterior. On the other hand, in the multi-chip semiconductor device according to this embodiment, not only the parent chip but also a child chip is electrically connected to the exterior.

A parent chip 10 is a logic chip such as ASIC, for example. As is explained with reference to FIG. 1A, on the front surface of the parent chip 10, a plurality of bump electrodes 11 are arranged in a matrix form. The bump electrodes among the bump electrodes 11 which are arranged on the outermost periphery are bump electrodes for connection with the exterior which transfer signals with respect to the chip exterior and the other bump electrodes among the bump electrodes 11 are bump electrodes which transfer signals with respect to the child chip.

An interposer (wiring substrate) 20 is formed of a synthetic resin thin-film substrate such as a synthetic resin film or synthetic resin film or silicon thin-film substrate, for example, and has a square planar shape. As is explained with reference FIG. 1B, a square opening 21 is formed in substantially the central portion of the interposer 20. The planar shape of the opening is smaller than the planar shape of the parent chip 10. Further, as is explained with reference FIG. 1B, a plurality of electrode terminals 22 are formed on the front surface of the interposer 20 near the opening 21, a plurality of electrode terminals 23 are formed on the front surface of the peripheral portion and a plurality of wirings 24 which electrically connect corresponding ones of the electrode terminals 22 and 23 to one another are formed on the front surface thereof.

For example, a child chip 30 is a semiconductor memory chip connected to the parent chip 10. As is explained with reference to FIG. 1C, a plurality of bump electrodes 31 are arranged and formed in a matrix form on the front surface of the child chip 30. The bump electrodes 31 formed on the child chip 30 are used to transfer signals with respect to the bump electrodes 11 of the parent chip 10 other than the bump electrodes for connection with the exterior. As shown in FIG. 10, the size of the planar shape of the interposer 20 is smaller than that of the child chip 30. Further, a plurality of electrode terminals (electrode pads) 32 for connection with the exterior are formed on the periphery on the front surface of the child chip 30.

As is explained with reference to FIG. 2, the parent chip 10 and child chip 30 are arranged with the bump electrodes thereof set to face each other on both sides of the interposer 20. Further, the back surface of the interposer 20 is adhered to the front surface side of the child chip 30 by use of an insulating adhesive agent or the like and the bump electrodes 11 for connection with the exterior arranged on the outermost periphery on the front surface of the parent chip 10 are electrically connected to the electrode terminals 22 formed near the opening 21 of the interposer 20. In addition, the bump electrodes 11 other than the bump electrodes for connection with the exterior arranged on the front surface of the parent chip 10 are electrically connected to the bump electrodes 31 formed on the front surface of the child chip 30 in the opening 21 of the interposer 20.

In the multi-chip semiconductor device of the present embodiment, since the bump electrodes 11 of the parent chip 10 for connection with the exterior are lead out via the electrode terminals 22, wirings 24 and electrode terminals 23 formed on the interposer 20 even in a case where the planar shape of the parent chip 10 is smaller than that of the child chip 30 and the bump electrodes 11 of the parent chip 10 for connection with the exterior are hidden by the child chip 30, the electrical connection between the parent chip 10 and the child chip 30 can be easily attained.

Further, since the electrode terminals 32 for connection with the exterior are formed on the peripheral portion of the front surface of the child chip 30, the child chip 30 can be easily electrically connected to the chip exterior like the case of the parent chip 10.

FIG. 11 is a cross-sectional view of a multi-chip semiconductor device obtained by mounting the multi-chip semiconductor device assembled as shown in FIG. 10 on a package substrate 40, electrically connecting the package substrate 40 to the electrode terminals 23 of the interposer 20 and the electrode terminals 32 formed on the front surface of the child chip 30 and resin-sealing the thus obtained structure. As shown in FIG. 11, a plurality of electrode terminals 46 formed on the back surface of the package substrate 40 are electrically connected to the electrode terminals 23 formed on the interposer 20 via bonding wires (metal wires) 43. Further, the electrode terminals 46 formed on the back surface of the package substrate 40 are electrically connected to a plurality of electrode terminals 32 for connection with the exterior formed on the periphery of the front surface of the child chip 30 via bonding wires 52. Sealing resin 44 is filled on the back surface of the package substrate 40.

The connection by the bonding wires 43 and 52 can be easily attained as shown in FIG. 11 by shifting the formation positions of the electrode terminals 23 and 32 arranged on the same sides of the interposer 20 and child chip 30 as shown in FIG. 10.

When the size of the planar shape of the interposer 20 is smaller than that of the child chip 30 as in the multi-chip semiconductor device of the present embodiment, not only the parent chip 10 but also the child chip 30 can be electrically connected to the exterior by forming the electrode terminals 32 for connection with the exterior on the periphery of the front surface of the child chip 30.

<Manufacturing Method of Interposer>

Figure 12:
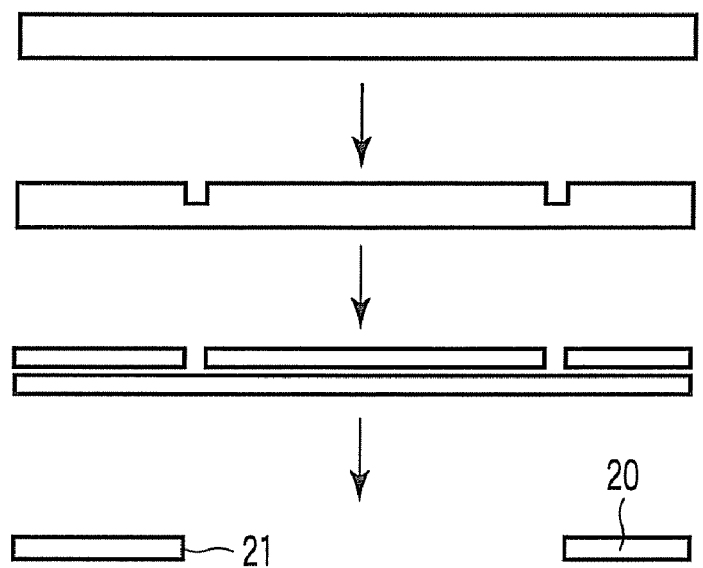
FIG. 12 is a cross-sectional view for illustrating a manufacturing method of an interposer used in the multi-chip semiconductor device of each embodiment.

Next, a manufacturing method of the interposer used in each of the above embodiments is explained. First, as shown in FIG. 1B, a plurality of electrode terminals (electrode pads) 22, electrode terminals (electrode pads) 23 and a plurality of wires 24 are formed on the front surface of a thin-film substrate formed of silicon or synthetic resin. When the thin-film substrate is a silicon thin-film substrate, a groove corresponding in position to the outer periphery of an opening 21 is formed to depth corresponding to the desired thickness of the interposer by a method using laser, the reactive ion etching (RIE) method or the like as shown in the cross section of FIG. 12. Then, an interposer 20 having the opening 21 is formed by polishing the back surface portion of the silicon thin-film substrate until the groove is reached.

Figure 13:
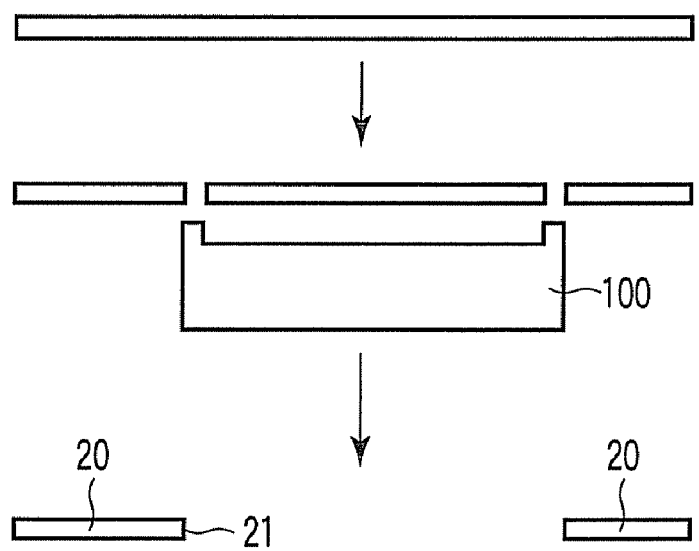
FIG. 13 is a cross-sectional view for illustrating another manufacturing method of an interposer used in the multi-chip semiconductor device of each embodiment.

On the other hand, when the thin-film substrate is a synthetic resin thin-film substrate such as a synthetic resin film or synthetic resin tape, a desired opening 21 is cut out by press working by use of a metal mould 100 as shown in the cross section of FIG. 13 and thus the interposer 20 having the opening 21 is formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-chip semiconductor device comprising:
a wiring substrate having an opening formed in a central portion thereof, a plurality of first electrode terminals arranged and formed on a front surface thereof near the opening, a plurality of second electrode terminals arranged and formed on the front surface of a peripheral portion thereof and a plurality of wirings used to electrically connect corresponding ones of the plurality of first and second electrode terminals to one another and formed on the front surface,
a first semiconductor chip having a plurality of first bump electrodes arranged and formed on a front surface thereof, and
a second semiconductor chip which has a plurality of second bump electrodes containing a plurality of bump electrodes for connection with an exterior arranged and formed on a front surface thereof and is arranged with the front surface thereof set to face the front surface of the first semiconductor chip with the wiring substrate disposed therebetween, those of the plurality of second bump electrodes other than the plurality of bump electrodes for connection with the exterior being electrically connected to the plurality of first bump electrodes of the first semiconductor chip in the opening of the wiring substrate and the plurality of second bump electrodes for connection with the exterior being electrically connected to the plurality of first electrode terminals of the wiring substrate.

2. The device according to claim 1, wherein a planar shape of the first semiconductor chip is larger than a planar shape of the second semiconductor chip.

3. The device according to claim 1, wherein the first semiconductor chip is a memory chip and the second semiconductor chip is a logic chip.

4. The device according to claim 1, wherein the wiring substrate is a silicon thin-film substrate.

5. The device according to claim 1, wherein the wiring substrate is a synthetic resin thin-film substrate.

6. The device according to claim 1, further comprising:
a package substrate which has a plurality of electrodes for connection with the exterior formed on a front surface thereof, whose back surface is adhered to a back surface of the first semiconductor chip and which has a plurality of third electrode terminals electrically connected to the plurality of electrodes for connection with the exterior and is formed on the back surface, and
a plurality of metal wires which electrically connect the plurality of second electrode terminals of the wiring substrate with the plurality of third electrode terminals of the package substrate.

* * * * *